(12) United States Patent
Kermalli (10) Patent No.: US 9,083,294 B2
(45) Date of Patent: Jul. 14, 2015

(54) APPARATUS AND METHOD FOR MULTILEVEL LOSSLESS OUTPHASING POWER AMPLIFIER

(71) Applicant: FutureWei Technologies, Inc., Plano, TX (US)

(72) Inventor: Munawar Kermalli, Morris Plains, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 14/207,298

(22) Filed: Mar. 12, 2014

(65) Prior Publication Data

US 2014/0266465 A1 Sep. 18, 2014

Related U.S. Application Data

(60) Provisional application No. 61/780,569, filed on Mar. 13, 2013.

(51) Int. Cl.
*H04L 25/03* (2006.01)
*H03F 3/24* (2006.01)
*H03F 1/02* (2006.01)

(52) U.S. Cl.
CPC .................. *H03F 3/24* (2013.01); *H03F 1/025* (2013.01); *H03F 1/0294* (2013.01); *H03F 3/245* (2013.01); *H03F 2200/507* (2013.01); *H03F 2200/511* (2013.01)

(58) Field of Classification Search
CPC ......... H03F 1/0294; H03F 3/211; H03F 1/32; H03F 3/24; H03F 2200/336; H03F 1/0261; H03F 1/0211; H04B 1/0483
USPC .............. 375/295, 296, 297; 330/250, 142 R; 332/106, 107, 123, 117, 149, 159, 160
See application file for complete search history.

(56) References Cited

U.S. PATENT DOCUMENTS

| | | | | |
|---|---|---|---|---|
| 8,346,189 B2 * | 1/2013 | Dupuy et al. | ............... | 455/114.1 |
| 8,451,053 B2 * | 5/2013 | Perreault et al. | ........... | 330/124 R |
| 8,472,896 B2 * | 6/2013 | Xu et al. | ........................ | 455/110 |
| 8,659,353 B2 * | 2/2014 | Dawson et al. | ........... | 330/124 R |

(Continued)

OTHER PUBLICATIONS

Chung, et al., "Asymmetic Multilevel Outphasing Architecture for Multi-standard Transmitters," Radio Frequency Integrated Circuits Symposium, IEEE, RFIC, Jun. 2009, pp. 237-240.
Perreault, David J., "A New Power Combining and Outphasing Modulation System for High-efficiency Power Amplification," 53rd IEEE International Midwest Symposium on Circuits and Systems, Aug. 2010, pp. 441-444.
Gerhard, W., et al., "Improvement of Power Amplifier Efficiency by Reactive Chireix Combining, Power Back-off and Differential Phase Adjustment," IEEE MTT-S International Microwave Symposium Digest, Jun. 11-16, 2006, pp. 1887-1890.

(Continued)

*Primary Examiner* — Tesfaldet Bocure
(74) *Attorney, Agent, or Firm* — Slater & Matsil, L.L.P.

(57) ABSTRACT

System and method embodiments are provided for a multi-level outphasing amplifier architecture with a non-isolating or lossless combiner. The multilevel outphasing amplifier with lossless combiner improves power efficiency in comparison to outphasing amplifiers with lossless combiners. The multilevel outphasing amplifier applies different voltage levels to the power amplifiers (PAs) of the circuit according to the input signal power range. Additionally, tunable reactive compensation is applied to the compensation components (capacitor and inductor) of the lossless combiner as a function of the multilevel voltage setting of the PAs. The efficiency at the back-off region is improved by varying the compensation elements of the lossless combiner along with the drain voltage to the PAs as a function of the input signal power or amplitude.

19 Claims, 6 Drawing Sheets

(56) References Cited

U.S. PATENT DOCUMENTS

| | | | |
|---|---|---|---|
| 8,824,978 B2* | 9/2014 | Briffa et al. | 455/102 |
| 8,913,974 B2* | 12/2014 | Sorrells et al. | 455/127.1 |
| 2005/0110590 A1* | 5/2005 | Korol | 332/149 |
| 2013/0241625 A1* | 9/2013 | Perreault et al. | 327/355 |
| 2014/0120854 A1* | 5/2014 | Briffa et al. | 455/127.3 |
| 2014/0125412 A1* | 5/2014 | Dawson et al. | 330/251 |

OTHER PUBLICATIONS

Qureshi, J.H., "A 90-W Peak Power GaN Outphasing Amplifier With Optimum Input Signal Conditioning," IEEE Transaction on Microwave Theory and Technologies, vol. 57, No. 8, Aug. 2009, pp. 1925-1935.

* cited by examiner

APPARATUS AND METHOD FOR MULTILEVEL LOSSLESS OUTPHASING POWER AMPLIFIER

This application claims the benefit of U.S. Provisional Patent Application Ser. No. 61/780,569, filed on Mar. 13, 2013, and entitled "System and Method for Multilevel Lossless Outphasing Power Amplifier," which application is incorporated herein by reference.

TECHNICAL FIELD

The present invention relates to power amplifier architecture and design, and, in particular embodiments, to a system and method for a multilevel lossless outphasing power amplifier.

BACKGROUND

Some outphasing amplifiers use an isolating combiner to allow signal pre-distortion schemes. However, the isolating combiner includes an isolating load resistor that dissipates a significant amount of power when the outphasing angle is varied to produce low level signals. Multilevel outphasing can be used with the isolating combiner to reduce the amount of wasted energy in the isolating combiner. An outphasing amplifier with a non-isolating combiner (such as a Chireix combiner) is an amplifier circuit that can provide improved power efficiency over a wide input range, e.g., in comparison to an outphasing amplifier with an isolating combiner. The non-isolating combiner is also referred to as a lossless combiner, and the two terms are used herein interchangeably. The power efficiency is a measure of the power needed to operate the amplifier for amplifying an input signal to a specific output level. The improved power efficiency makes such circuit attractive or advantageous for use in some applications. However, the outphasing amplifier with a lossless combiner suffers from low power efficiency in the low input power range, also referred to as the back-off region. There is a need for an improved architecture for the outphasing amplifier with a lossless combiner that overcomes such issue to improve overall power efficiency of the system.

SUMMARY OF THE INVENTION

In accordance with an embodiment, a multilevel outphasing power amplifier includes a signal decomposer configured to decompose an input signal with varying amplitude into two constant amplitude signals with varying outphasing angle, two power amplifiers (PAs) coupled to the signal decomposer and configured to amplify the two constant amplitude signals, a non-isolating combiner comprising tunable reactive compensation elements coupled to the two PAs and configured to combine the two amplified constant amplitude signals to provide an amplified output signal with varying amplitude, the amplified output signal is proportional to the input signal, and a switchable voltage supply coupled the signal decomposer and the two PAs and configured to select one of a plurality of voltage levels for the two PAs according to an amplitude of the input signal.

In accordance with another embodiment, a multilevel outphasing power amplifier includes a signal amplitude detector configured to receive an input signal with varying amplitude and detect an amplitude of the input signal, a splitter coupled to the signal amplitude detector and configured to split the input signal to provide two constant amplitude signals, two PAs coupled to the splitter and configured to amplify the two constant amplitude signals with varying outphasing angle, a non-isolating combiner comprising tunable reactive compensation elements coupled to the two PAs and configured to combine the two amplified constant amplitude signals to provide an amplified output signal with varying amplitude, the amplified output signal is proportional to the input signal, and a switchable voltage supply coupled the signal amplitude detector and the two PAs and configured to select one of a plurality of voltage levels for the two PAs according to the detected amplitude of the input signal.

In accordance with yet another embodiment, a method for multilevel outphasing in an outphasing amplifier with a lossless combiner includes receiving, at a signal decomposer, an input signal with varying amplitude over time, decomposing the input signal into two constant amplitude signals with varying outphasing angle proportional to the varying amplitude, detecting an amplitude of the input signal, adjusting, at a voltage supply, a voltage level from a set of available voltage levels according to the detected amplitude, applying, to at least one of two PAs, the voltage level, amplifying, at the two PAs, the two constant amplitude signals using the applied voltage level, and combining, at the lossless combiner, the two constant amplitude signals to provide an amplified output signal with varying amplitude proportional to the input signal.

BRIEF DESCRIPTION OF THE DRAWINGS

For a more complete understanding of the present invention, and the advantages thereof, reference is now made to the following descriptions taken in conjunction with the accompanying drawing, in which:

FIG. 6b shows an envelope efficiency for the different drain voltages in FIG. 6a.

FIG. 6c shows the power density function of an input signal corresponding to the envelope efficiency of FIG. 6a;

FIG. 7b shows an envelope efficiency for the different drain voltages in FIG. 7a.

FIG. 7c shows the power density function of an input signal corresponding to the envelope efficiency of FIG. 7a.

DETAILED DESCRIPTION OF ILLUSTRATIVE EMBODIMENTS

The structure and operation of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

System and method embodiments are provided for implementing a multilevel outphasing amplifier architecture with a non-isolating or lossless combiner. The embodiments provide improved power efficiency, e.g., in comparison to a typical outphasing amplifier with a lossless combiner. The embodiments use a multilevel outphasing scheme, which includes applying different voltage levels to the power amplifiers (PAs) of the circuit according to the input signal power range. Additionally, tunable reactive compensation is applied at the lossless combiner, e.g., as a function of the multilevel voltage setting of the PAs. The efficiency at the back-off region is improved by varying the compensation elements (capacitor and inductor) of the lossless combiner (also referred to as a non-isolating combiner) along with the drain voltage to the PAs as a function of the input signal power or amplitude.

Figure 1:
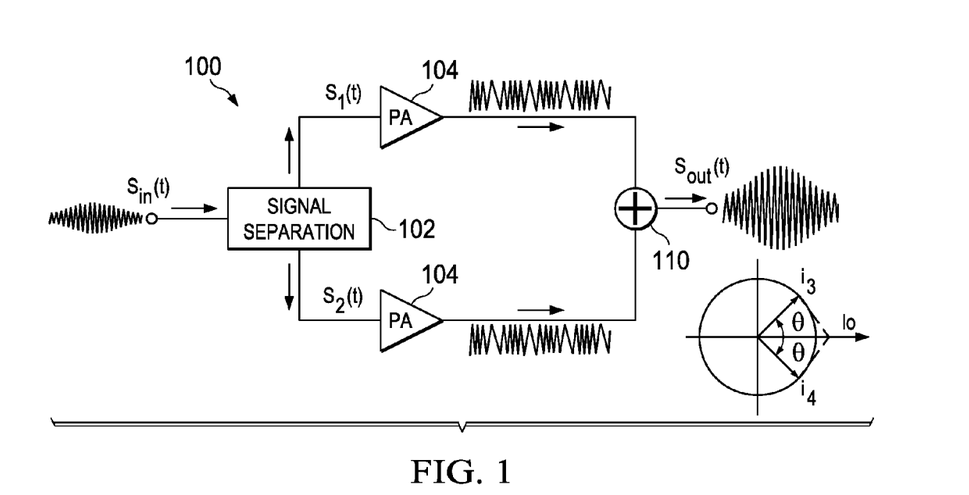
FIG. 1 shows an example of an outphasing amplifier circuit.

FIG. 1 shows an example of an outphasing amplifier circuit 100 with a signal combiner 110. In addition to the signal combiner 110, the outphasing amplifier circuit 100 comprises a signal decomposer 102 (e.g., including one or more circuit components or devices) and two PAs 104 coupled to the signal decomposer 102 and the signal combiner 110. The system may be used in any transmitter/receiver (transceiver) component such as in communications or network components, for example in a wireless or cellular base station system.

The signal decomposer 102 decomposes an input signal, $S_{in}$, into two constant envelope signals $S_1$ and $S_2$ (also referred to herein as component signal), which may have a fixed and equal power or signal amplitude. The $S_1$ and $S_2$ are respectively forwarded to two corresponding PAs 104, such that S1 is sent to one PA, and S2 is sent to the other PA. $S_1$ and $S_2$ may be current signals. The signal decomposer 102 also introduces an outphasing angle between $S_1$ and $S_2$ as a function of the input signal power. The outphasing angle can be varied by varying the phase angle (θ) for each of the two decomposed signals. Each of the PAs 104 receives one of the outphased constant envelope signals, amplifies the signal and outputs the amplified signal to the signal combiner 110. The signal combiner 110 comprises a first branch coupled to one of the PAs 104 and a second branch coupled to the other PA 104. The signal combiner 110 may be an isolating (or hybrid) combiner or a non-isolating (or lossless) combiner. The signal combiner 110 combines the two amplified and outphased constant envelope signals into a final amplified output version, $S_{out}$, of the original input signal, $S_{in}$. The amplitude of $S_{out}$ is proportional to that of $S_{in}$. The signals $S_{in}$, $S_1$, $S_2$, and $S_{out}$ in FIG. 1 are shown as functions of time, t.

Figure 2:
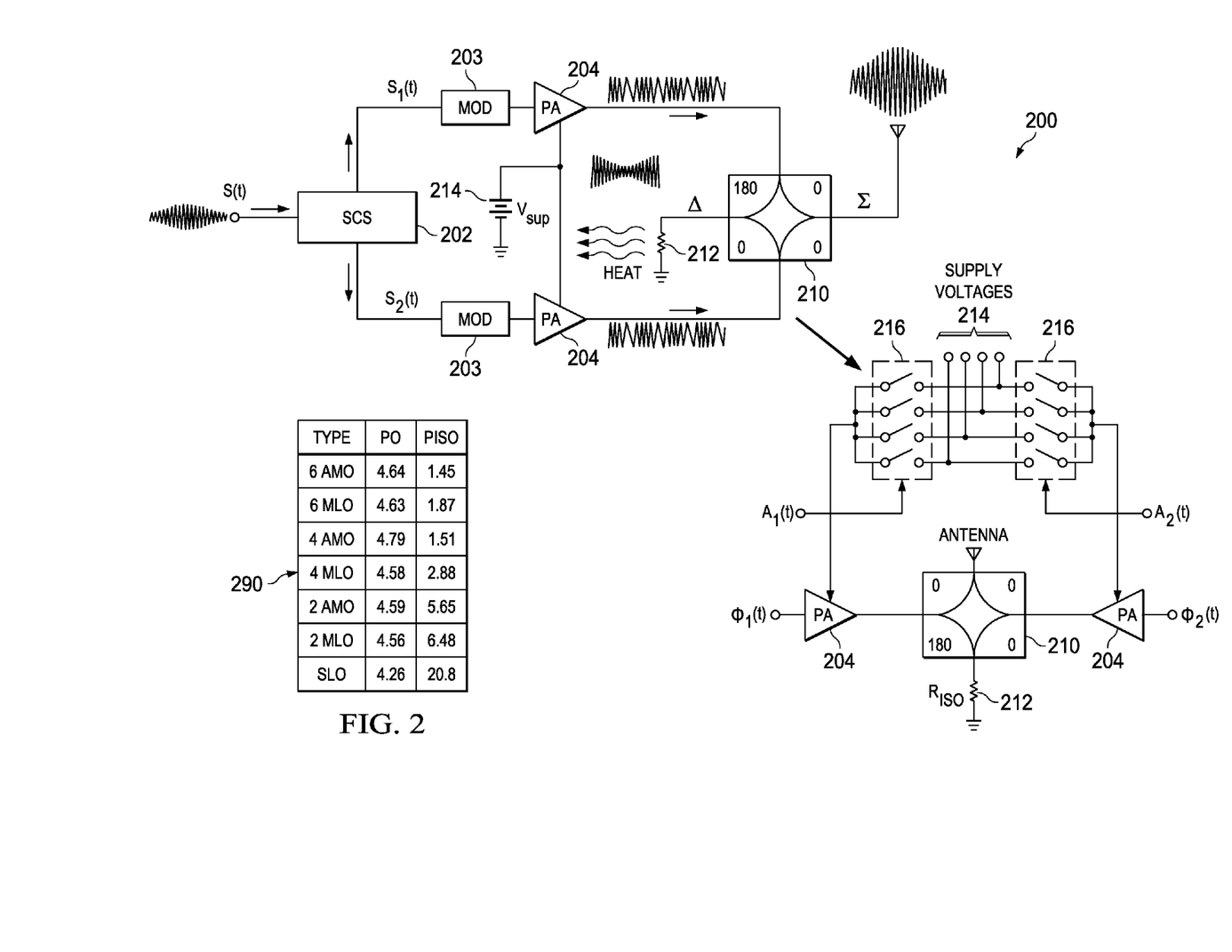
FIG. 2 shows an example of a multilevel outphasing amplifier circuit.

A multilevel outphasing scheme can be used in an outphasing amplifier with an isolating combiner to reduce the amount of dissipated and wasted energy in the isolating combiner. FIG. 2 shows an example of a multilevel outphasing amplifier circuit 200 with an isolating combiner 210. In addition to the signal combiner 210, the multilevel outphasing amplifier circuit 200 comprises a signal decomposer 202 and two PAs 204 coupled to the signal decomposer 202 and the combiner 210. The signal decomposer 202 and two PAs 204 operate similar to the corresponding components of the circuit 100. A modulator 203 may also be added on each of the two paths between the signal decomposer 202 and the two PAs 204 to modulate the decomposed signals $S_1$ and $S_2$ according to a suitable modulation scheme. The signal combiner 210 is an isolating combiner that includes an isolation or load resistor 212. The isolating or load resistor 212 can dissipate significant power in the form of heat when the outphasing angle is varied by the signal decomposer 202 to produce low level signals, e.g., in the back-off region.

To reduce the amount of dissipated power at the resistor 212, a multilevel outphasing scheme is used, where different drain voltages can be applied to the two PAs 204 according to the amplitude of the original signal, S, or to the corresponding outphasing angle. The outphasing angle can be varied by varying the phase angles $\Phi_1$ and $\Phi_2$ for the decomposed signals $S_1$ and $S_2$, respectively. The multilevel outphasing can be implemented using a plurality of parallel and switchable voltage rails 216 in the voltage supply 214 that connect to each of the PAs 204. For example, the voltage rails 216 can be arranged as shown in FIG. 2. A voltage rail 216 is selected on each end (e.g., via a switch) to provide a determined voltage level or amount to a corresponding PA 204, e.g., according to S amplitude or corresponding outphasing angle. Each level may be used for a range of amplitudes of S. The same voltage level can be switched on to both PAs 204. This applies equal or symmetric gain to the two PAs 204. Alternatively, asymmetric gain can be applied to the two PAs 204 (to amplify $S_1$ and $S_2$) by switching on different voltage levels. Switching the rails 216 can be controlled by control signals, $A_1$ and $A_2$, for the two PAs 204, respectively.

Table 290 shows different cases that can be used for the multilevel outphasing scheme. In the case of a single level outphasing (SLO) or no multilevel outphasing, the drain voltage applied to each of the PAs 204 is fixed. This causes significant power dissipation (Piso) in the isolation resistor 212 vs. output power (Po), for example, 20.8 watts for Piso vs. 4.26 watts for Po in an example scenario. In the case of a two multilevel outphasing (2 MLO), two equal levels of drain voltages are switched on for the two PAs 204. This improves efficiency (ratio of Po to Piso) in comparison to the SLO case, e.g., 6.48 watts for Piso vs. 4.56 watts for Po in the same example scenario. In the case of a two asymmetric multilevel outphasing (2 AMO), two different levels of drain voltages are switched on for the two PAs 204. This further improves efficiency, e.g., 5.65 watts for Piso vs. 4.59 watts for Po in the same example scenario. Table 290 shows further improvements in efficiency as more voltage levels are used. The asymmetric cases can also yield some improvement over the symmetric cases.

In an embodiment, to further improve power efficiency, a non-isolating or lossless combiner can be used with a multilevel outphasing amplifier circuit, e.g., instead of the isolating combiner in the circuit 200 above. The lossless combiner uses compensation elements, such as capacitors and inductors, to combine the signals ($S_1$ and $S_2$) from the two amplifiers, e.g., instead of the lossy isolating resistor of the isolating combiner. This causes higher power efficiency. A multilevel outphasing scheme is implemented, as described below, to improve the efficiency of the lossless combiner in the back-off region and hence the overall operation efficiency of the circuit.

Figure 3:
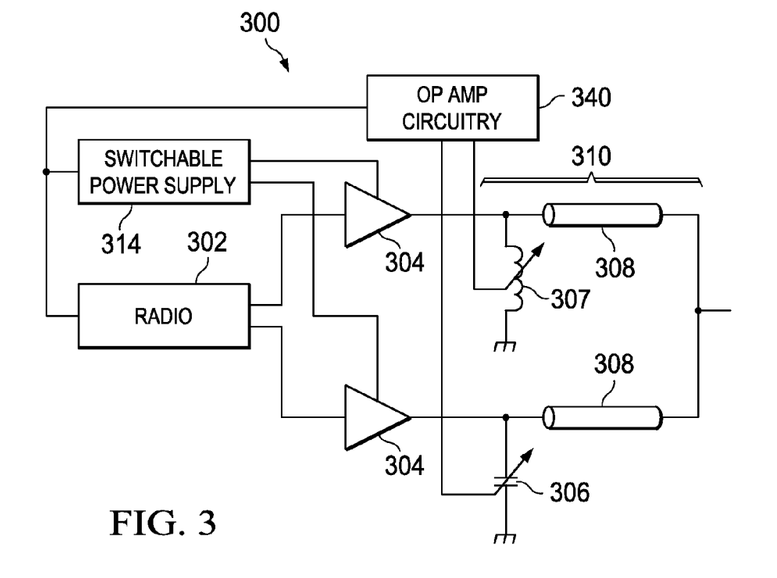
FIG. 3 shows an embodiment of a multilevel outphasing amplifier circuit with a lossless combiner.

FIG. 3 shows an embodiment of a multilevel outphasing amplifier circuit 300 with a non-isolating or lossless combiner 310. The system may be used in any transmitter/receiver (transceiver) component such as in communications or network components, for example in a base station system. In addition to the lossless combiner 310, the outphasing amplifier circuit 300 comprises a radio 302 (e.g., including one or more circuit components or devices) and two PAs 304 coupled to the radio 302 and the non-isolating or lossless combiner 310. The radio 302 is a signal source that can generate a varying amplitude or power signal (e.g., in time) and decomposes the signal into two constant envelope signals ($S_1$ and $S_2$) that are sent to two corresponding PAs 304. The radio 302 also introduces an outphasing angle between $S_1$ and $S_2$ as a function of the original signal power. The amplitude of the generated signal at the radio 302 may be varied by an external control signal. The components of the circuit 300 can be arranged as shown in FIG. 3 or in any other suitable arrangement that achieves similar functionality.

The lossless combiner 310 may be, for example, a Chireix combiner and combines the two amplified signals from the two PAs 304 to provide an amplified output version of the signal generated at the radio 302. Thus, the amplified output signal from the lossless combiner 310 varies in amplitude or power over time proportional to the original signal of the radio 302. The lossless combiner 302 includes a first branch coupled to one of the PAs 304 and a second branch coupled to the other PA 304. The first branch includes a tunable capacitor 306 that is grounded and coupled to a transmission line 308 and the output of the combiner 310. The second branch includes a tunable inductor 307 that is grounded and coupled to a second transmission line 308 and the output of the combiner 310.

Additionally, the circuit 300 includes a switchable voltage or power supply 314 coupled to the radio 302 and each of the PAs 304, and an operational amplifier (op-amp) circuitry 340 coupled to the radio 302 and to each of the tunable capacitor 306 and tunable inductor 307 in the lossless combiner 310. The switchable power supply 314 is configured, similar to the voltage supply 214, to apply different voltage levels to each of the two PAs 204, for instance using switchable voltage rails and switches similar to the switchable voltage rails 216. The switchable power supply 314 implements symmetric multilevel outphasing (MLO) or asymmetric multilevel outphasing (AMO), where different voltage levels are applied to each of the PAs 304 according to the amplitude of the signal generated at the radio 302. The amplitude or power range of the signal can be classified into regions or amplitude ranges, where a suitable voltage level is switched to each PA 304 for each region. The radio 302 may send a control signal, based on the generated signal's amplitude, to the switchable power supply 314 to switch the proper voltage level.

Further, the op amp circuitry 340 is configured to tune one or both of the tunable capacitor 306 and the tunable inductor 307 according to the amplitude of the signal at the radio 302, the voltage level applied to each of the PAs 304, or both. For instance, the tunable capacitor 306 may include a plurality of switchable capacitors with different capacitance that are selected (e.g., via a switch) by the op amp circuitry 340 according to the signal power or amplitude. Similarly, the tunable inductor 307 may include a plurality of switchable inductors with different inductance that are selected (e.g., via a switch) by the op amp circuitry 340 according to the signal's amplitude. Alternatively, the tunable capacitor 306 may be a variable capacitor that is tuned by a control signal from the op amp circuitry 340. Similarly, the tunable inductor 307 may be a variable inductor that is tuned by the op amp circuitry 340. The radio 302 may send a control signal, based on the generated signal's amplitude, to the op amp circuitry 340 to properly tune the tunable capacitor 306 and/or the tunable inductor 307.

In other embodiments, the op amp circuitry 340 may be coupled to the switchable power supply 314 instead of the radio 302 or to both the switchable power supply 314 and the radio 302. As such, the radio 302 and/or the switchable power supply 314 can send a control signal, based on the generated signal's amplitude and/or the applied drain voltages to the PAs 304, to the op amp circuitry 340 to properly tune the tunable capacitor 306 and/or the tunable inductor 307.

Figure 4:
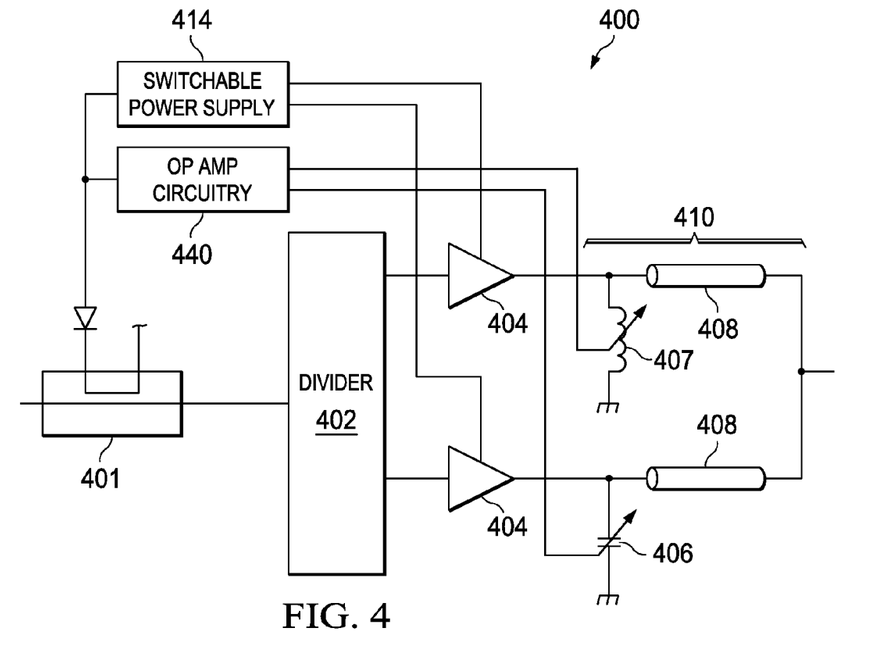
FIG. 4 shows another embodiment of a multilevel outphasing amplifier circuit with a lossless combiner.

FIG. 4 shows another embodiment of a multilevel outphasing amplifier circuit 400 with a lossless or non-isolating combiner 410. The system may be used in any transmitter/receiver (transceiver) component such as in communications or network components, for example in a base station system. In addition to the lossless combiner 410, the outphasing amplifier circuit 400 comprises an amplitude detector 401 (e.g., including one or more circuit components or devices), a splitter or divider 402 coupled to the amplitude detector 401, and two PAs 404 coupled to the splitter 402 and the lossless combiner 410. The lossless combiner 410 may be, for example, a Chireix combiner and includes a first branch coupled to one of the PAs 404 and a second branch coupled to the other PA 404. The first branch includes a tunable capacitor 406 grounded and coupled to a transmission line 408 and the output of the combiner 410. The second branch includes a tunable inductor 407 grounded and coupled to a second transmission line 308 and the output of the combiner 410. The components of the circuit 400 can be arranged as shown in FIG. 4 or in any other suitable arrangement that achieves similar functionality.

Additionally, the circuit 400 includes a switchable voltage or power supply 414 coupled to the amplitude detector 401 and each of the PAs 404, and an op-amp circuitry 440 coupled to the amplitude detector 401 and to each of the tunable capacitor 406 and tunable inductor 407 in the lossless combiner 310. The components of the circuit 400 are configured and operate similar to the respective components of the circuit 300. However, unlike the radio 302, the amplitude detector 401 is configured to pass an input signal, e.g., with varying amplitude over time, from a radio (not shown) to the splitter or divider 402 and detect the envelope amplitude of the signal. The splitter 402 is configured to split the signal into two similar constant amplitude signals ($S_1$ and $S_2$) and send each to a corresponding PA 404. The outphasing angle can be introduced by varying the phase angle on the path between the splitter 402 and each or one of the PAs 404. The phase can be varied by any suitable phase delay component on a branch (not shown) that extends from the amplitude detector 401 to each or one of the two PAs 404. Thus, the outphasing signal can be controlled according to the detected incoming signal amplitude by the amplitude detector 401. The amplitude detector 401 can also control, according to the detected incoming signal amplitude, each of the switchable power supply 414 (to select the voltage levels at the PAs 404) and the op amp circuitry 440 (to tune the tunable capacitor 406 and/or the tunable inductor 407).

In other embodiments, the op amp circuitry 440 may be coupled to the switchable power supply 414 instead of the amplitude detector 401 or to both the switchable power supply 414 and the amplitude detector 401. As such, the amplitude detector 401 and/or the switchable power supply 414 can send a control signal, based on the signal's amplitude at the amplitude detector 401 and/or the applied drain voltages to the PAs 404, to the op amp circuitry 440 to properly tune the tunable capacitor 406 and/or the tunable inductor 407.

Figure 5:
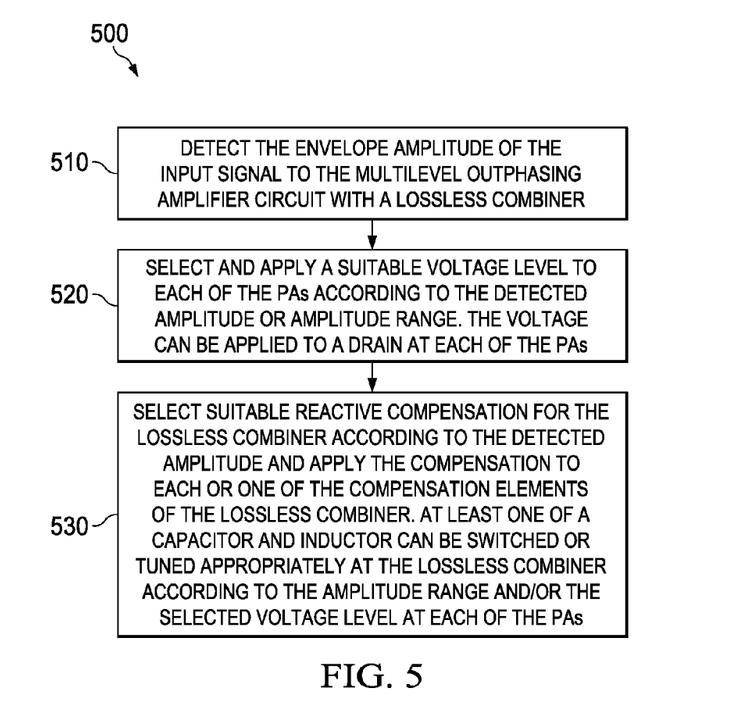
FIG. 5 shows an embodiment of an operation method of a multilevel outphasing amplifier circuit with a lossless combiner.

FIG. 5 shows an embodiment of an operation method 500 of a multilevel outphasing amplifier circuit with a lossless combiner. The method 500 can be implemented in a multilevel outphasing amplifier circuit with a non-isolating or lossless combiner, such as the circuit 300 or 400. At step 510, the envelope amplitude of the input signal is detected (e.g., at the radio 302 or the amplitude detector 401). At step 520, a suitable voltage level is selected (e.g., at the switchable power supply 314 or 414) and applied to each of the PAs according to the detected amplitude. The voltage is applied to a drain at each of the PAs. The same voltage level can be applied to the two PAs 304 or 404 (the symmetric MLO case). Alternatively, different voltage levels can be applied to the two PAs 304 or 404 (the AMO case). The appropriate voltage level can be selected from a set of available voltages (e.g., via a switch) according to the amplitude range of the input signal to improve or maximize power efficiency. The set of or available voltage values or levels may be pre-determined based on prior study or analysis during circuit design.

At step 530, suitable reactive compensation is selected (e.g., at the op amp circuitry 340 or 440) for the lossless combiner (e.g., the lossless combiner 310 or 410), according to the detected amplitude or amplitude range. The compensation is applied for each or one of the compensation elements of the lossless combiner. For instance, at least one of a capacitor and an inductor is switched or tuned appropriately at the lossless combiner according to the amplitude range of the input signal and/or the selected voltage level at each of the PAs.

Figure 6A:
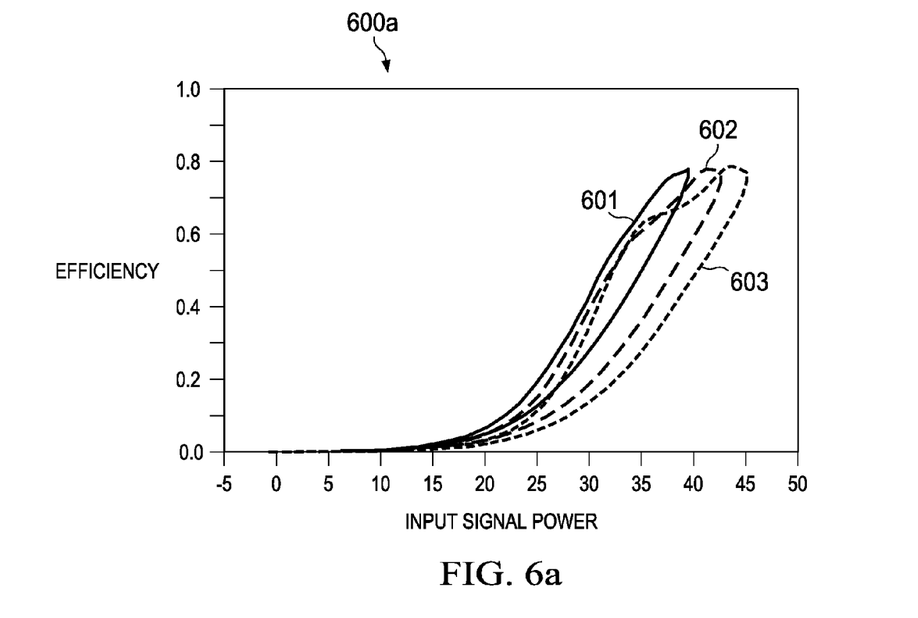
FIG. 6a shows simulated results of achieved efficiency with different drain voltages for a multilevel outphasing amplifier with a non-isolating combiner.
Figure 6B:
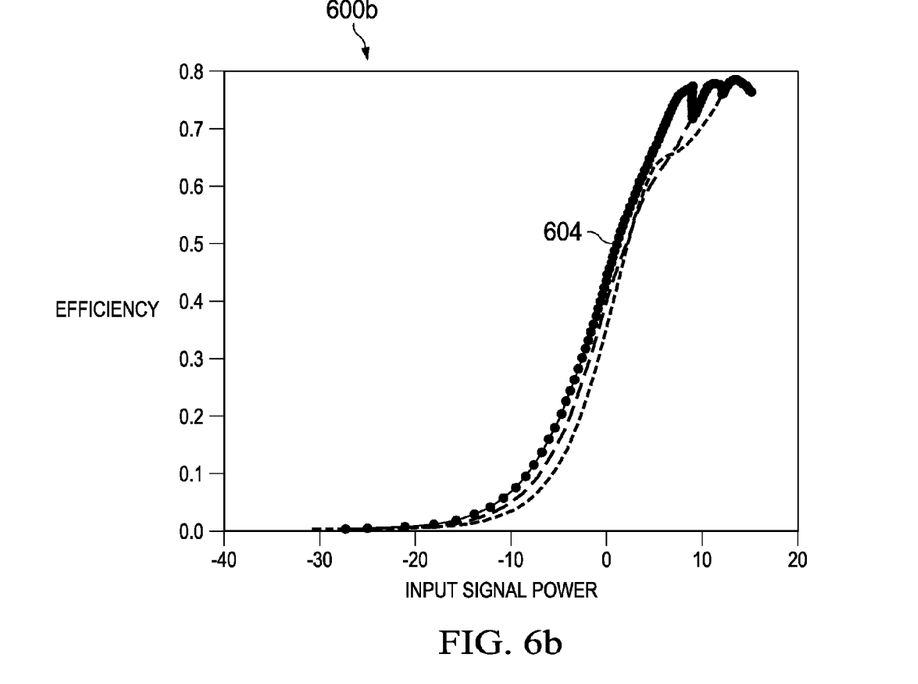
Figure 6C:
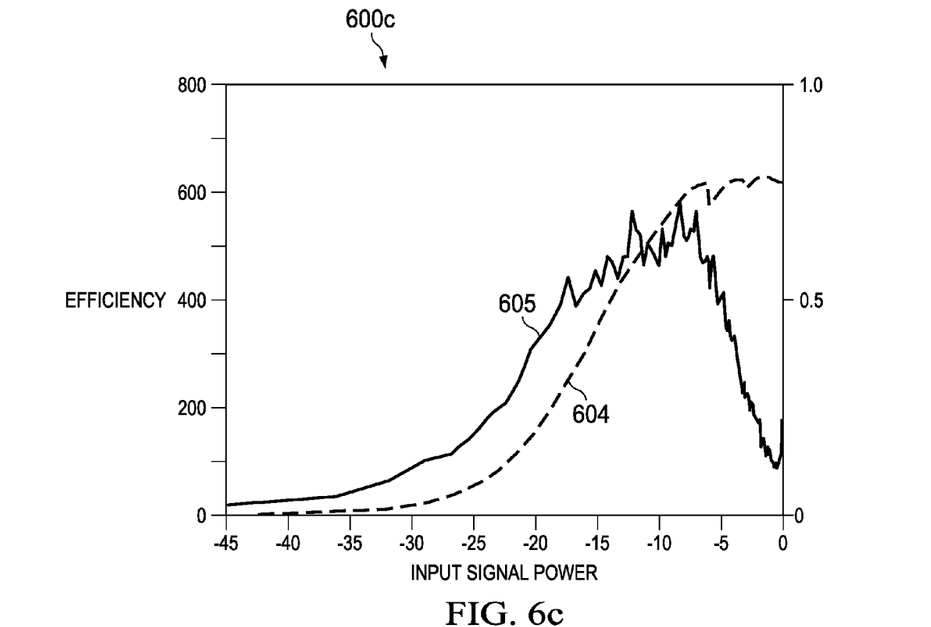

FIGS. 6a, 6b, and 6c show graphs of simulated values for a multilevel outphasing amplifier with a lossless combiner. The values are obtained by simulating a PA device model. FIG. 6a shows simulated results of efficiency of different drain voltages for the device. Three curves reflect the efficiency vs. input signal power (in relative dB scale) for three different drain voltage values: 14 volts (curve 601), 21 volts (curve 602), and 28 volts (curve 603). The curves show that the drain voltage 14V provides higher efficiency in the input signal power range below about 39 dB on the relative scale, the drain voltage 21V provides higher efficiency in the input signal power range from about 39 to about 42 dB on the relative scale, and the drain voltage 28V provides higher efficiency in the input signal power range above about 39 dB on the relative scale. FIG. 6b shows the envelope efficiency (curve 604) for the different drain voltages of curves 601, 602, and 603. The envelope efficiency (curve 604) reflects the highest achieved efficiency, computed by integrating the power density of the input signal with the envelope efficiency in FIG. 6c, across a back-off region of input signal power by switching between the three examined voltage levels.

Figure 7A:
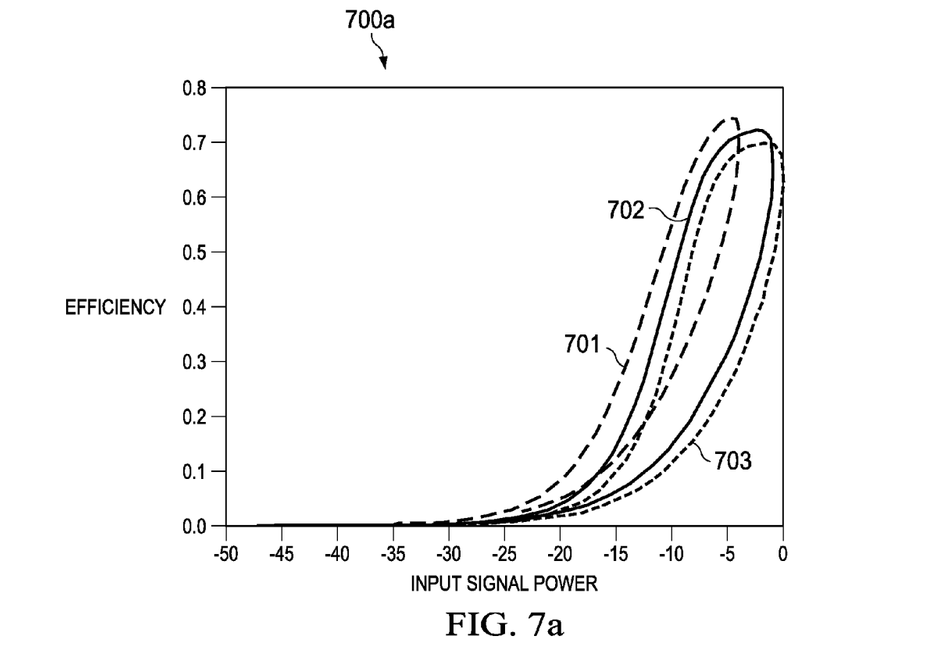
FIG. 7a shows simulated results of achieved efficiency with different drain voltages for another multilevel outphasing amplifier with a non-isolating combiner.
Figure 7B:
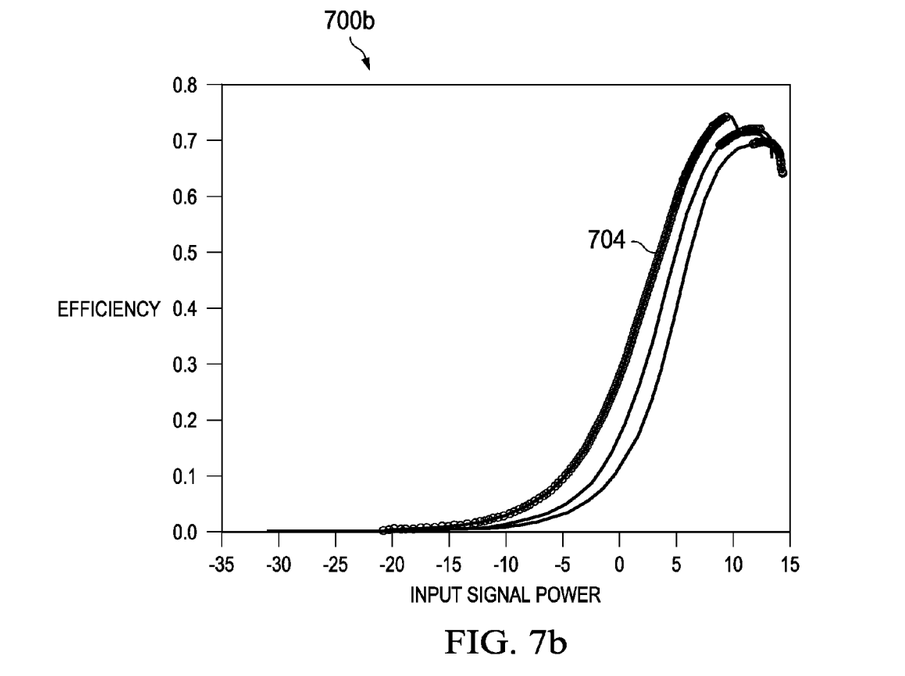
Figure 7C:
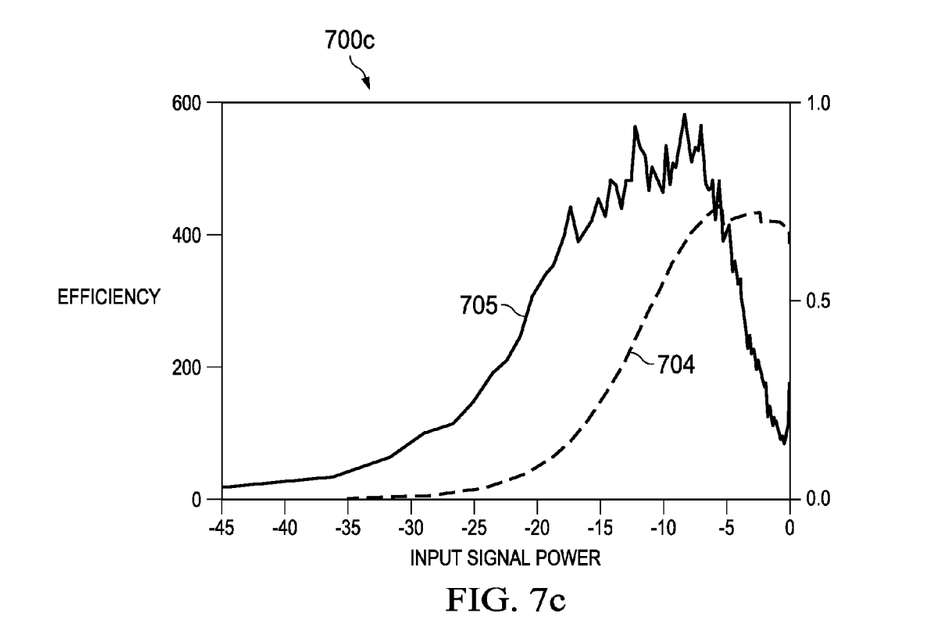

FIGS. 7a, 7b, and 7c show graphs of simulated values for another multilevel outphasing amplifier with a lossless combiner. FIG. 7a shows measured results of efficiency of different drain voltages for the module. Three curves reflect the efficiency vs. input signal power (in relative dB scale) for three different drain voltage values: 15 volts (curve 701), 23 volts (curve 702), and 27 volts (curve 703). The curves show that the drain voltage 15V provides higher efficiency in the input signal power range below about −5 dB on the relative scale, the drain voltage 23V provides higher efficiency in the input signal power range from about −5 to about −1 dB on the relative scale, and the drain voltage 27V provides higher efficiency in the input signal power range above about −1 dB on the relative scale. FIG. 7b shows the envelope efficiency (curve 704) for the different drain voltages of curves 701, 702, and 703. FIG. 7c shows the power distribution function of the input signal power (curve 705) corresponding to the envelope efficiency (curve 704), which shows the highest efficiency across a back off region achieved by switching between different voltages, and optimizing the reactive components on the lossless combiner for each voltage setting.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A multilevel outphasing power amplifier comprising:
  a signal decomposer configured to decompose an input signal with varying amplitude into two constant amplitude signals with varying outphasing angle;
  two power amplifiers (PAs) coupled to the signal decomposer and configured to amplify the two constant amplitude signals;
  a non-isolating combiner comprising tunable reactive compensation elements coupled to the two PAs and configured to combine the two amplified constant amplitude signals to provide an amplified output signal with varying amplitude, the amplified output signal is proportional to the input signal; and
  a switchable voltage supply coupled the signal decomposer and the two PAs and configured to select one of a plurality of voltage levels for the two PAs according to an amplitude of the input signal.

2. The multilevel outphasing power amplifier of claim 1 further comprising a control circuit coupled to the non-isolating combiner and configured to tune the tunable reactive compensation elements of the non-isolating combiner.

3. The multilevel outphasing power amplifier of claim 2, wherein the signal decomposer is coupled to the control circuit and configured to indicate the amplitude of the input signal to the control circuit, and wherein the control circuit is configured to tune the tunable reactive compensation elements of the non-isolating combiner according to the amplitude of the input signal.

4. The multilevel outphasing power amplifier of claim 2, wherein the signal decomposer is a radio source coupled to both the switchable voltage supply and the control circuit, the radio is configured to provide the two constant amplitude signals with varying outphasing angle to the two PAs and indicate the amplitude of the input signal to the switchable voltage supply and the control circuit.

5. The multilevel outphasing power amplifier of claim 2, wherein the tunable reactive compensation elements include:
  a tunable capacitor coupled to the control circuit and to one of the two PAs on a first branch of the non-isolating combiner; and
  a tunable inductor coupled to the control circuit and to the other one of the two PAs on a second branch of the non-isolating combiner.

6. The multilevel outphasing power amplifier of claim 5, wherein the non-isolating combiner further comprises:
  a first transmission line coupled to the tunable capacitor and an output of the non-isolating combiner, wherein the tunable capacitor is grounded and coupled in parallel to the first transmission line; and
  a second transmission line coupled to the tunable inductor and the output of the non-isolating combiner, wherein the tunable inductor is grounded and coupled in parallel to the second transmission line.

7. The multilevel outphasing power amplifier of claim 5, wherein the tunable capacitor includes a plurality of switchable capacitors and a switch configured to connect one of the switchable capacitors to the first branch of the non-isolating combiner to tune the tunable capacitor according to the control circuit.

8. The multilevel outphasing power amplifier of claim 5, wherein the tunable inductor includes a plurality of switchable inductors and a switch configured to connect one of the switchable inductors to the second branch of the non-isolating combiner to tune the tunable inductor according to the control circuit.

9. The multilevel outphasing power amplifier of claim 2, wherein the switchable voltage supply is coupled to the control circuit and configured to indicate a selected voltage level to the control circuit, and wherein the control circuit is configured to tune the tunable reactive compensation elements of the non-isolating combiner according to the selected voltage level.

10. The multilevel outphasing power amplifier of claim 1, wherein the switchable voltage supply is coupled to a drain of each of the two PAs and comprises:
   a voltage supply configured to provide the voltage levels; and
   switchable voltage rails each associated with one of the voltage levels, the switchable voltage rails are configured to connect the voltage supply to the two PAs and provide the same one of the voltage levels at a time to the two PAs.

11. The multilevel outphasing power amplifier of claim 1, wherein the switchable voltage supply is coupled to a drain of each of the two PAs and comprises:
   a voltage supply configured to provide the voltage levels; and
   switchable voltage rails each associated with one of the voltage levels, the switchable voltage rails are configured to connect the voltage supply to the two PAs and provide two different voltages at a time to the two PAs respectively.

12. A power amplifier component comprising:
   a signal amplitude detector configured to receive an input signal with varying amplitude and detect an amplitude of the input signal;
   a splitter coupled to the signal amplitude detector and configured to split the input signal to provide two constant amplitude signals;
   two power amplifiers (PAs) coupled to the splitter and configured to amplify the two constant amplitude signals with varying outphasing angle;
   a non-isolating combiner comprising tunable reactive compensation elements coupled to the two PAs and configured to combine the two amplified constant amplitude signals to provide an amplified output signal with varying amplitude, the amplified output signal is proportional to the input signal; and
   a switchable voltage supply coupled the signal amplitude detector and the two PAs and configured to select one of a plurality of voltage levels for the two PAs according to the detected amplitude of the input signal.

13. The power amplifier component of claim 12 further comprising a control circuit coupled to the signal amplitude detector and the two PAs, the control circuit is configured to tune the tunable reactive compensation elements of the non-isolating combiner according to the amplitude of the input signal or a selected voltage level at the switchable voltage supply.

14. The power amplifier component of claim 12 further comprising at least one path that couples the signal amplitude detector to at least one of the two PAs, the path configured to introduce and vary an outphasing angle between the two constant amplitude signals according to the varying amplitude of the input signal.

15. A method for multilevel outphasing in an outphasing amplifier with a lossless combiner, the method comprising:
   receiving, at a signal decomposer, an input signal with varying amplitude over time;
   decomposing the input signal into two constant amplitude signals with varying outphasing angle proportional to the varying amplitude;
   detecting an amplitude of the input signal;
   adjusting, at a voltage supply, a voltage level from a set of available voltage levels according to the detected amplitude;
   applying, to at least one of two power amplifiers (PAs), the voltage level;
   amplifying, at the two PAs, the two constant amplitude signals using the applied voltage level;
   combining, at the lossless combiner, the two constant amplitude signals to provide an amplified output signal with varying amplitude proportional to the input signal; and
   tuning or switching, at the lossless combiner, at least one of a capacitor and an inductor according to the detected amplitude, the voltage level, or both the detected amplitude and the voltage level.

16. The method of claim 15, wherein at least one of a capacitor and an inductor is tuned or switched upon determining that the detected amplitude is within a back-off region.

17. The method of claim 15, wherein the same voltage level is applied to the two PAs to amplify the two constant amplitude signals.

18. The method of claim 15, wherein a different voltage level is applied to the two PAs to amplify the two constant amplitude signals.

19. The method of claim 15, wherein the voltage level is adjusted and applied upon determining that the detected amplitude is within a back-off region.

* * * * *